(12) United States Patent
Baek et al.

(10) Patent No.: US 9,733,480 B2
(45) Date of Patent: Aug. 15, 2017

(54) HEAD-MOUNTED DISPLAY DEVICE

(71) Applicant: Samsung Electronics Co., Ltd., Gyeonggi-do (KR)

(72) Inventors: Jongsun Baek, Seoul (KR); Sukjin Yun, Seoul (KR); Sangjin Wang, Gyeonggi-do (KR); Jiseong Hwang, Gyeonggi-do (KR); Donghyeon Kim, Gyeonggi-do (KR); Youngjin Yi, Gyeonggi-do (KR); Jongchul Choi, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 33 days.

(21) Appl. No.: 14/839,609

(22) Filed: Aug. 28, 2015

(65) Prior Publication Data

US 2016/0062125 A1    Mar. 3, 2016

(30) Foreign Application Priority Data

Sep. 1, 2014  (KR) .................... 10-2014-0115662

(51) Int. Cl.
| | |
|---|---|
| *G06F 1/16* | (2006.01) |
| *G02B 27/01* | (2006.01) |
| *H05K 5/00* | (2006.01) |
| *H05K 5/02* | (2006.01) |

(52) U.S. Cl.
CPC ......... *G02B 27/0176* (2013.01); *G06F 1/163* (2013.01); *H05K 5/0004* (2013.01); *H05K 5/0017* (2013.01); *H05K 5/0086* (2013.01); *H05K 5/0204* (2013.01); *G02B 2027/0136* (2013.01); *G02B 2027/0156* (2013.01)

(58) Field of Classification Search
CPC ............................... G06F 1/163; G06F 1/1632
USPC ..................................................... 361/679.03
See application file for complete search history.

(56) References Cited

U.S. PATENT DOCUMENTS

| | | | |
|---|---|---|---|
| 6,150,998 A | * 11/2000 | Travers ................. | A42B 3/042 345/8 |
| 8,957,835 B2 | 2/2015 | Hoellwarth | |

(Continued)

FOREIGN PATENT DOCUMENTS

| | | |
|---|---|---|
| CN | 101799585 | 8/2011 |
| DE | 20 2013 102 458 U1 | 7/2013 |

(Continued)

OTHER PUBLICATIONS

Extended European Search Report dated Jan. 26, 2016 in connection with European Application No. 15183230.5, 8 pages.

(Continued)

*Primary Examiner* — Adrian S Wilson

(57) ABSTRACT

A head-mounted display device is provided. The head-mounted display device includes: a frame having one surface formed to face a user's face; a wearing part formed to be coupled to at least a part of the frame so as to allow the frame to be fixed to the face; a mounting part formed in a cavity structure so that an external electronic device is capable of being mounted on the other surface of the frame; and one or more fastening parts that fix the external electronic device to the mounting part, wherein the fastening parts has an inclined opening angle.

26 Claims, 18 Drawing Sheets

(56) References Cited

U.S. PATENT DOCUMENTS

| | | | | |
|---|---|---|---|---|
| 2003/0137584 | A1* | 7/2003 | Norvell | B60R 11/0235 348/61 |
| 2003/0227746 | A1* | 12/2003 | Sato | G06F 1/1632 361/679.57 |
| 2004/0257753 | A1* | 12/2004 | Rossini | E05B 73/0082 361/679.27 |
| 2007/0174645 | A1* | 7/2007 | Lin | G11B 31/00 713/322 |
| 2008/0027572 | A1* | 1/2008 | Romoser | B60R 11/02 700/94 |
| 2008/0270665 | A1* | 10/2008 | Senatori | G06F 1/1616 710/303 |
| 2009/0129010 | A1* | 5/2009 | Park | G06F 1/1632 361/679.56 |
| 2010/0079356 | A1 | 4/2010 | Hoellwarth | |
| 2010/0195279 | A1* | 8/2010 | Michael | G06F 1/1632 361/679.41 |
| 2011/0031287 | A1* | 2/2011 | Le Gette | F16M 11/04 224/101 |
| 2011/0075331 | A1* | 3/2011 | Greig | G06F 1/1632 361/679.01 |
| 2011/0188197 | A1* | 8/2011 | Jackson | H05K 5/00 361/679.41 |
| 2012/0033375 | A1* | 2/2012 | Madonna | F16M 11/041 361/679.43 |
| 2012/0293924 | A1* | 11/2012 | Dolci | G06F 1/1632 361/679.01 |
| 2014/0290466 | A1* | 10/2014 | Butera | G10H 1/32 84/609 |
| 2014/0362445 | A1 | 12/2014 | Welker | |
| 2015/0217188 | A1* | 8/2015 | Houvener | A63F 13/211 463/7 |
| 2015/0234189 | A1* | 8/2015 | Lyons | G02B 27/0172 345/174 |
| 2015/0234192 | A1* | 8/2015 | Lyons | G02B 27/0172 345/8 |

FOREIGN PATENT DOCUMENTS

| | | |
|---|---|---|
| ES | 1115455 | 7/2014 |
| KR | 10-2014-0078237 | 6/2014 |
| WO | WO 2015/138266 A1 | 9/2015 |

OTHER PUBLICATIONS

Ben Lang, "Google: 'Cardoard is a Placeholder', 6,000 Kits and 5,000+ App Downloads in First Week", Jul. 1, 2014, retrieved from Internet: URL: http//www.roadtovr.com/google-cardboard-virtual-reality-6000-kits-50000-app-downloads-first-week, 8 pages.

* cited by examiner

Normal Mode

Head-Mounted Mode

Head-Mounted Mode see-through Mode

HEAD-MOUNTED DISPLAY DEVICE

CROSS-REFERENCE TO RELATED APPLICATION AND CLAIM OF PRIORITY

The present application is related to and claims benefit under 35 U.S.C. §119(a) of Korean patent application filed on Sep. 1, 2014 in the Korean Intellectual Property Office and assigned Serial number 10-2014-0115662, the entire disclosure of which is hereby incorporated by reference.

TECHNICAL FIELD

Various embodiments of the present disclosure are related to a head-mounted display device.

BACKGROUND

Recently, various electronic devices in a form capable of being directly worn on a body have been developed. Such devices are generally called wearable electronic devices.

Examples of wearable electronic devices worn on a part of a body include a Head-Mounted Display (HMD) device mounted on a user's head to display an image, smart glasses, a smart watch or wristband, a contact lens-type device, a ring-type device, a shoe-type device, a cloth-type device, and a glove-type device. The wearable electronic devices may take a form of being detachably attached to a part of a human body or clothes. In particular, the HMD may be formed in a goggle shape or an eyeglass shape.

As being directly worn on a body, the wearable electronic device may be improved in portability and a user's accessibility.

A display of the HMD device is capable of outputting an image at a position facing the user's eyes, and lenses may be positioned between the user and the display so as to correct the user's vision.

SUMMARY

To address the above-discussed deficiencies, it is a primary object to provide a head-mounted display device (HMD) according to various embodiments of the present disclosure configured such that a portable mobile communication terminal is used as a display and mounted on the head-mounted device. Thereby, it is possible to solve the inconvenience caused since the user should separately carry a terminal should when the user moves. For example, there is provided a structure, in which the terminal may be easily mounted/unmounted in relation to the frame of the head-mounted device by installing a USB connector at one side of the frame of the head-mounted device and a terminal holder at the other side of the frame.

A head-mounted display device (HMD) according to another embodiment provides a mode switching method of a head-mounted theater device, in which a step of mounting/unmounting a terminal in relation to the frame of the head-mounted display device and a step of wearing/non-wearing the frame by the user in the state where the terminal is mounted on the frame of the head-mounted display device are differentiated, and automatic mode switching can be performed in each step.

In accordance with an aspect of the present disclosure, a head-mounted display device is provided. The head-mounted display device includes: a main frame having one surface formed according to face a user's face; a wearing part formed to be coupled to at least a part of the main frame so as to allow the main frame to be fixed to the face; a mounting part formed in a cavity structure so that an external electronic device is capable of being mounted on the other surface of the main frame; and one or more fastening parts that fix the external electronic device to the mounting part, wherein the fastening parts has an arbitrary inclined opening angle.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 15 illustrates a configuration of the frame of the HMT device of FIG. 1;

DETAILED DESCRIPTION

Figure 1:
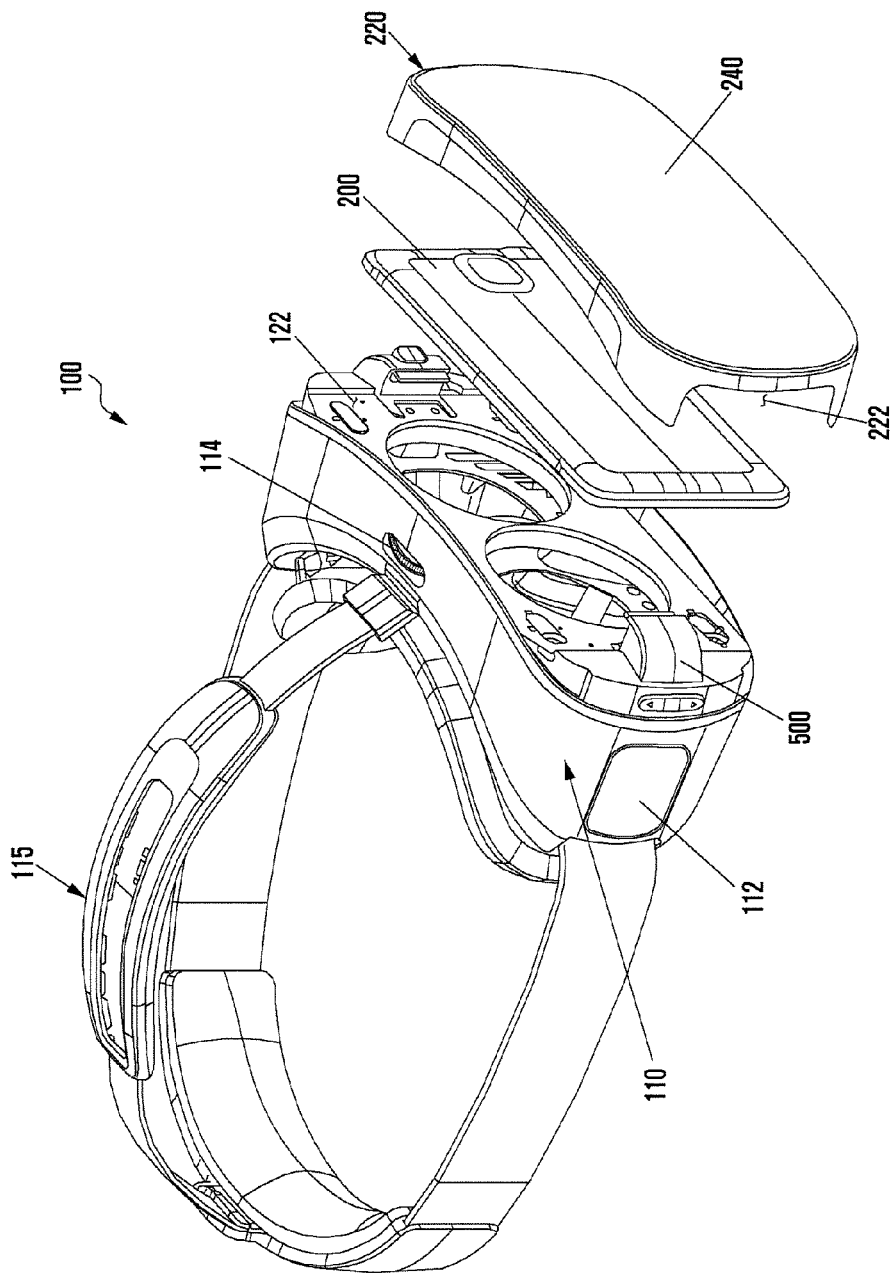
FIG. 1 illustrates a perspective view of a configuration of a Head-Mounted Theater (HMT) device to various embodiments of the present disclosure in a disassembled state.

FIGS. 1 through 18, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged mobile device and head-mounted device. Hereinafter, the present disclosure will be described with reference to the accompanying drawings. The present disclosure may have various embodiments, and modifications and changes may be made therein. Therefore, the present disclosure will be described in detail with reference to particular embodiments shown in the accompanying drawings. However, it should be understood that there is no intent to limit the present disclosure to the particular forms, and the present disclosure should be construed to cover all modifications, equivalents, and/or alternatives falling within the spirit and scope of the present disclosure. In describing the drawings, similar elements are designated by similar reference numerals.

A Head-Mounted Theater (HMT) device according to various embodiments of the present disclosure may provide, through a display, at least one of a see-through function that provides an Augmented Reality (AR) and a see-closed function that provides a Virtual Reality (VR).

Referring to a GOOGLE Glass device as an example, the see-through function may generally mean a function that, while transmitting real external things to a user's eyes through the display or a transparent/translucent lens, provides the things, or a virtual object or thing to the user using visual or various sensible means.

According to such a see-through function, additional information or images in relation to, e.g., really viewed things, may be provided to the user.

In another embodiment, additional information may be provided to the user using, for example, hologram rather than using a display or a lens.

Referring to SONY's HMZ as an example, the see-closed function is provided through a separate display. Two displays are placed in front of the user's eyes so that contents provided through the displays (e.g., a game, a movie, a streaming, or a broadcast) may be configured to be watched by the user. This function may improve the user's immersion using the independent screen.

Thus, the HMT device of the present disclosure may be differentiated from the existing HMD devices.

An external electronic device 200, detachably mounted on a main frame 110 of an HMT device 100 according to various embodiments of the present disclosure, may be a device including a communication function.

For example, the external electronic device 200 may be a smart phone, a tablet PC (Personal Computer), a mobile phone, a video phone, an e-book reader, a desktop PC, a laptop PC, a netbook computer, a PDA (Personal Digital Assistant), a PMP (Portable Multimedia Player), an MP3 player, a portable medical device, a digital camera, or a wearable device (e.g., an HMD (Head-Mounted Device) such as electronic glasses, electronic clothes, an electronic bracelet, an electronic necklace, electronic tattoos, an electronic appcessory, or a smart watch).

Figure 2:
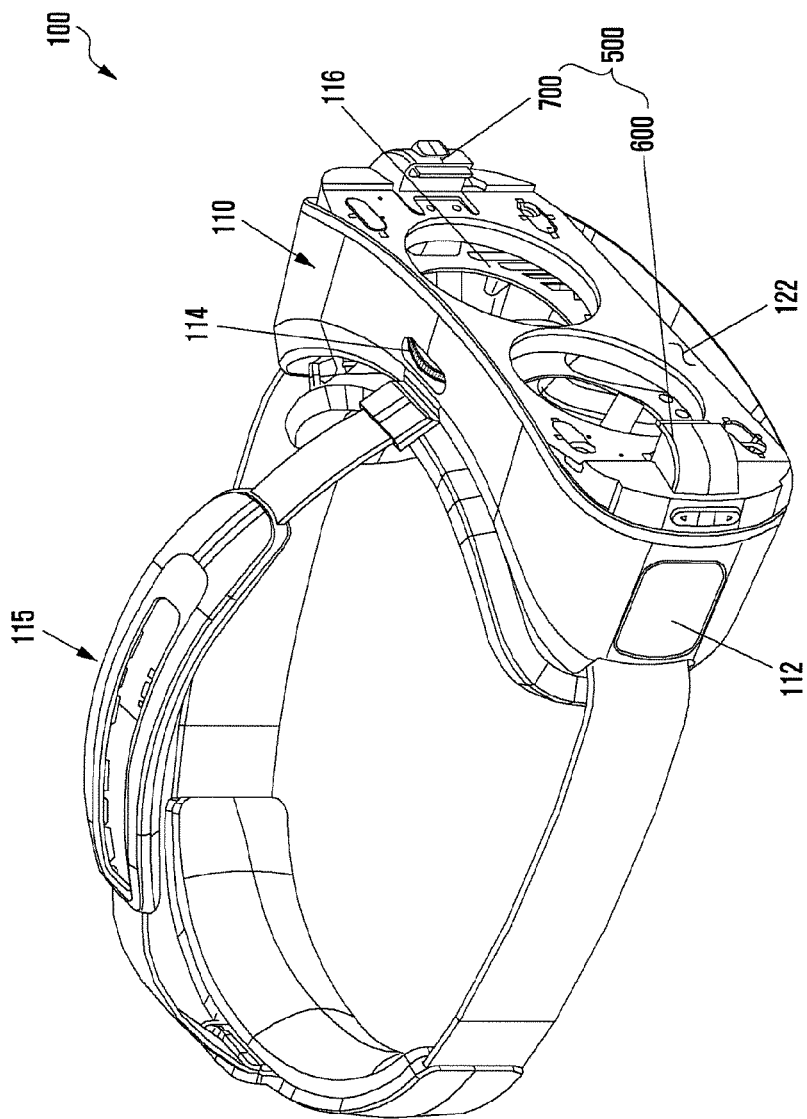
FIG. 2 illustrates a perspective view of the HMT device of FIG. 1 in an assembled state.
Figure 3:
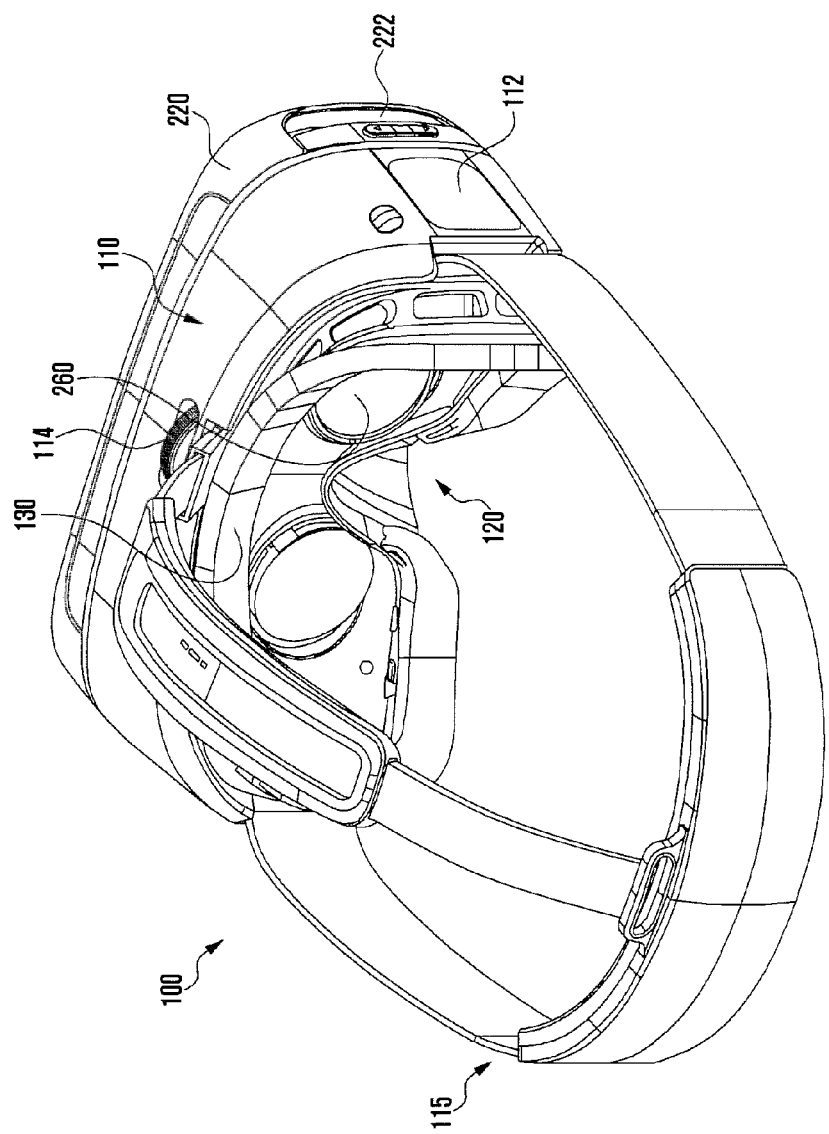
FIG. 3 illustrates a rear side perspective view of the HMT device of FIG. 2.
Figure 4:
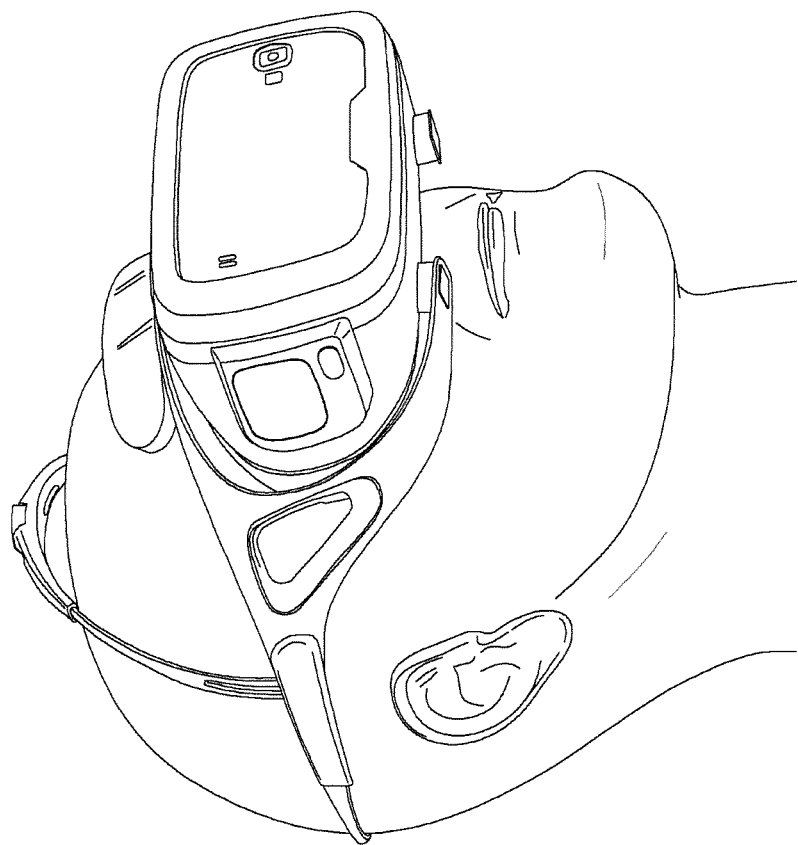
FIG. 4 illustrates the HMT device of FIG. 2 in the head-mounted state.

FIG. 1 illustrates a configuration of the HMT device 100 according to various embodiments of the present disclosure. FIG. 2 illustrates a state in which the HMT 100 is not coupled with the external electronic device 200 and a cover 220 is not mounted, and FIG. 3 illustrates a state in which the external electronic device 200 and the cover 220 are mounted. FIG. 4 illustrates a state where the user wears the HMT device 100.

Referring to FIGS. 1 to 4, according to various embodiments of the present disclosure, the HMT device 100 may include a main frame 110 and a wearing part 115 (e.g., a goggle band).

The main frame 110 may be mounted on at least a part of the user's face (e.g., a facial side), and may be supported on the user's facial side by various components.

In one embodiment, the wearing part 115 may allow the main frame 110 to come in close contact with the user's face around the eyes by adjusting the length of a band, and cushions may be attached to the band so as to provide a comfortable feeling to the user even if the wearing part 115 is worn for a long time.

Additionally, or alternatively, the wearing part 115 may be configure as, e.g., eyeglass temples, a helmet, or a strap.

The rear surface of the main frame 110 is a face contact part that is in contact with the user's facial part and may have a structure corresponding to the curve of the user's facial part. The rear surface may include an elastic body on at least a part thereof.

The elastic body may be formed using one or more cushion materials, such as sponge, so as to provide a comfortable wearing feeling when the face contact part 130 comes in contact with the user's facial part. The elastic body may be formed by using one sponge, or by joining one or more sponges having different compression rates. For example, the elastic body may be configured in three layers divided into top, middle, and bottom layers (not illustrated), in which the top and bottom layer may be formed of a sponge having a low compression rate, and the middle layer may be formed of a sponge having a high compression rate.

According to still another embodiment, the elastic body may be removably attached to the main frame 110. An adhesive member may be positioned on one surface of the elastic body so that the elastic body may be removably attached to the main frame 110 through the adhesive member. The adhesive member may be, for example, a Velcro member, an adhesive tape, or an adhesive. However, without being limited thereto, any removable adhesive member may be used. Through this, when several users (e.g., an adult and a child having different facial contours) use one HMT device, each user may use an elastic member suitable for the user, and when the surface of the elastic body is contaminated (for example, by make-up of a female user), or the elastic body is damaged due to frequent use, the elastic body may be replaced by a new one.

As a result, the HMT device 100 of the present disclosure may be easily worn on the user's facial part. For example, the main frame 110 may have a shape or structure to provide an external appearance that covers the user's eyes, and may include a nose recess 120, in which the user's nose may be located.

A lens assembly including at least one lens may be inserted into a part of the face contact part 130 at a position facing the user's eyes.

At least one surface of the lens may be exposed to the face contact part 130 such that, the user may watch the screen of the display device by eyes in a state where the user wears the HMT device 100 of the present disclosure.

In addition, the main frame 110 may be made of a material that is so light that the user may feel a comfortable feeling and is capable of supporting the external electronic device 200, for example, a plastic material.

In addition, the main frame 110 may further include a protective material that protects the HMT device 100 of the present disclosure.

As another embodiment, the protective material may include at least one of various materials such as, glass, plastic (e.g., ABS or polycarbonate), ceramics, metal (e.g., aluminum), and alloy (e.g., steel, stainless steel, titanium, or magnesium alloy), in consideration of strength and fine appearance.

The main frame 110 may include a touch pad 112, a display position adjustment unit 114, and a lens fixing unit 116. The main frame 110 may also include a mounting part 122 that is formed on the front surface of the main frame 110 to provide a space or structure, to which the external electronic device 200 is coupled.

The main frame 110 may further include a connector that enables communication with the external electronic device 200 coupled thereto.

In one embodiment, the connector may include an electrical connection part of the external electronic device 200, for example, a USB connector capable of being connected to a USB port. Through the electrical connection portion of the USB connector, a graphic user interface signal to be described later may be supplied to the external electronic device 200.

The mounting part 122 of the main frame 110 may correspond to the external appearance of the external electronic device 200.

In one embodiment, the mounting part 122 may include an elastic material or a flexible material so as to accommodate various sizes of external electronic devices 200 by deforming the size of the mounting part 122.

According to various embodiments of the present disclosure, the HMT device 100 may further include a cover 220 coupled to the main frame 110 so as to support the terminal of the external electronic device 200 more rigidly in the state where the terminal is fastened to the main frame 110.

The cover 220 may be mechanically coupled to the main frame 110 in a hook manner or magnetically or electromagnetically coupled to the main frame 110 using a magnet or an electromagnet.

In this way, the cover 220 may further prevent the terminal from being released from the main frame 110 and may form the external appearance of the main frame 110 to enhance an aesthetic feeling.

The cover 220 may further include a window 240 (FIG. 1) on its front surface, and the window 240 may serve to enhance the aesthetic feeling through various forms of materials and colors, for example.

The window 240 may be made of an ordinary plastic material, such as polycarbonate (PC) or acryl. Or, the window 240 may be made of a ceramic material, such as glass, sapphire, or transparent ceramic, or a metallic material, such as aluminum or SUS. The transparent material may be a colored material and may adjust transparency.

In addition, the cover 220 may include one or more openings 222. The openings 222 may easily release the heat generated from the terminal to the outside of the cover 220 so that the temperature of the terminal may be lowered to prevent the performance degradation of the terminal.

Further, the one or more openings 222 may reduce the weight of the cover 220, which is helpful for reducing the entire weight and hence attaining lightweight.

To the lens fixing unit 116 of the main frame 110, the display or the transparent/translucent lens 260 may be integrally fixed.

According to one embodiment, the display or the transparent/translucent lens 260 may be removably fixed.

In one embodiment, a lens assembly may be interposed between the display and the user's eyes.

The rear surface of the main frame 110 may include a soft material (e.g., sponge or rubber) so as to prevent the main frame 110 from coming in excessively close contact with the area around the user's eyes from the main frame 110.

In one embodiment, the main frame 110 may include a control device configured to control the external electronic device 200.

The control device may include at least one of e.g., a touch pad 112, a physical key, a physical button, a touch key, a joystick, or a wheel key on a side surface of the main frame 110.

In the present embodiment, the touch pad 112 may display Graphical User Interfaces (GUIs) capable of controlling a function of the external electronic device 200. For example, a GUI for sound setting may adjust an audio volume output from the external electronic device 200, and a GUI for image reproduction may control an image displayed by the external electronic device 200.

The touch pad 112 may receive the user's touch input (e.g., an input performed by directly touching the touch pad 112 or a hovering input).

The HMT device 100 of the present disclosure is connected with the external electronic device 200 using an interface, such as a USB, so that the HMT device 100 is capable of transmitting the received touch input to the external electronic device 200.

The external electronic device 200 may control a function corresponding to the touch input received from the HMT device 100 in response to the touch input. For example, the external electronic device 200 may adjust the volume or control image reproduction in response to the received touch input.

According to one embodiment, the display position adjustment unit 114 may be configured in the form of a wheel or a dial.

When the user turns the wheel or the dial implemented as the position adjustment unit 114, the external electronic device 200 may be moved so as to adjust the distance between the display of the external electronic device 200 and the user. As a result, the user may adjust the position of the external electronic device 200 so as to enjoy the displayed image to be suitable or optimal for the user's eyesight.

Meanwhile, the mounting part 122 of the main frame 110 may include fastening parts 500 configured to fasten the external electronic device 200 coupled thereto.

Figure 5:
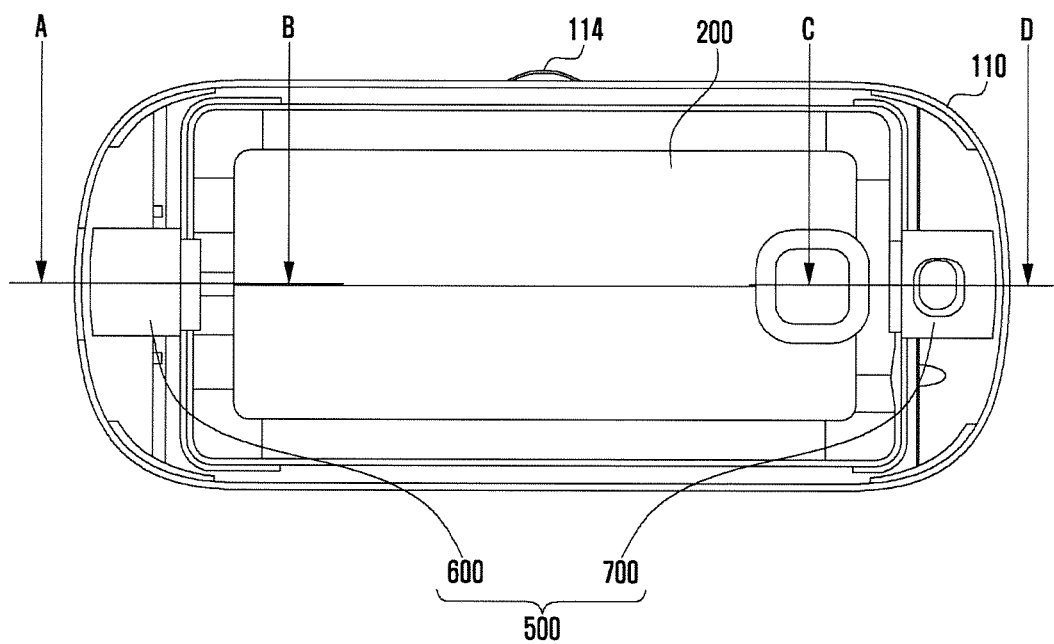
FIG. 5 illustrates a front view in a state where a terminal of an external electronic device is coupled to a main frame of FIG. 1.

FIG. 5 illustrates a state where the terminal of the external electronic device 200 is coupled to the main frame 110 of FIG. 1.

The fastening parts 500 may include a connector fastening part 600 formed on the main frame 100 at one side of the mounting part 122 and a terminal fastening unit 700 formed on the main frame 110 at the other side of the mounting part 122.

Figure 6:
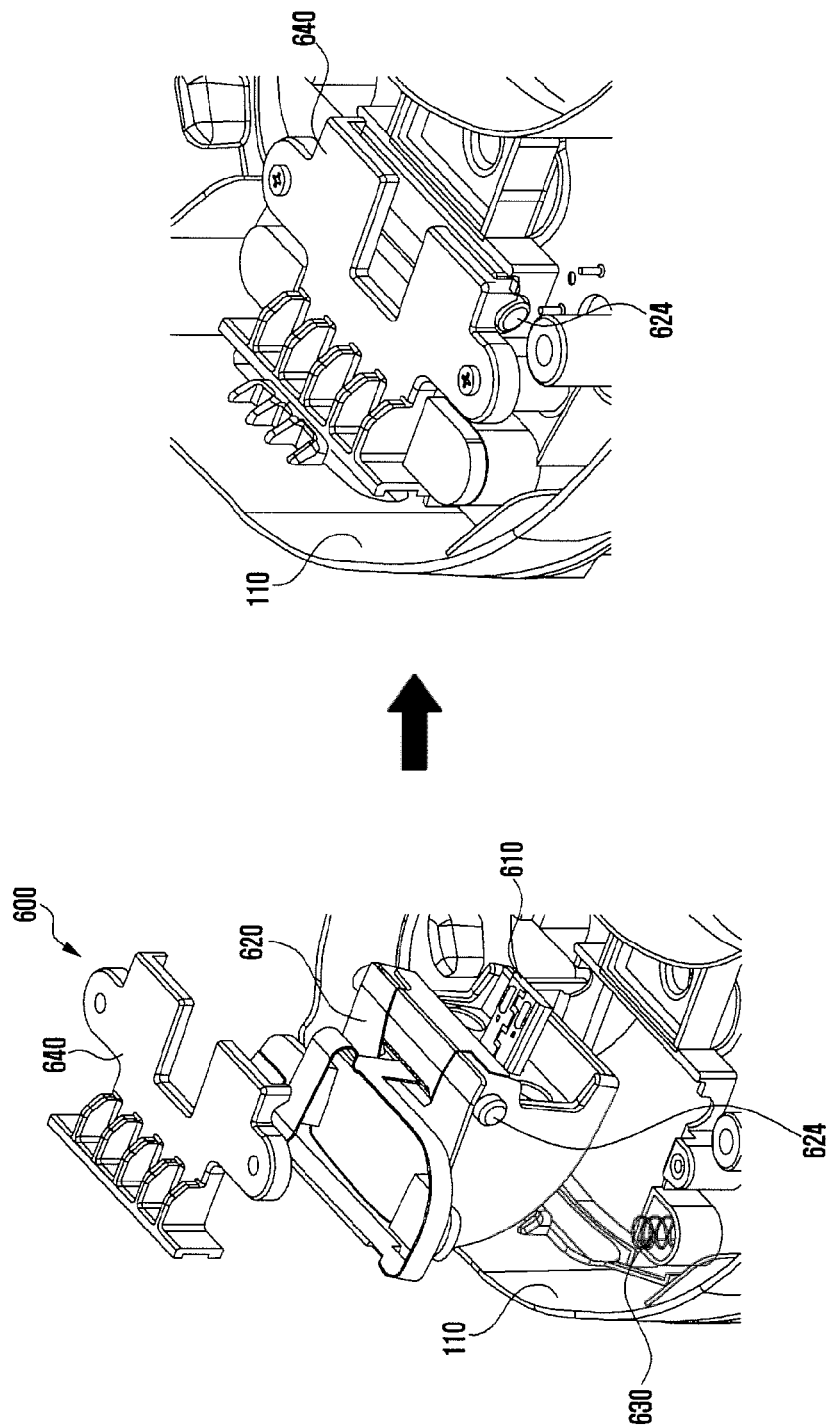
FIG. 6 illustrates a perspective view of a connector holder in a reversed and disassembled state the HMT device of FIG. 2.
Figure 7:
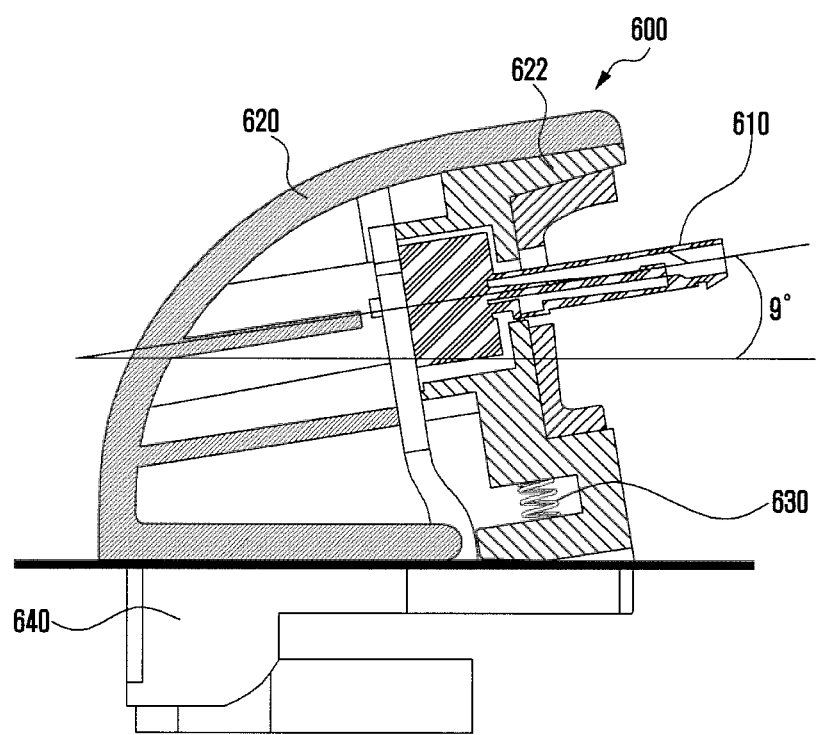
FIG. 7 illustrates a sectional view taken along line A-B in FIG. 5, in which a connector holder portion before fastening the terminal is illustrated in detail.
Figure 8:
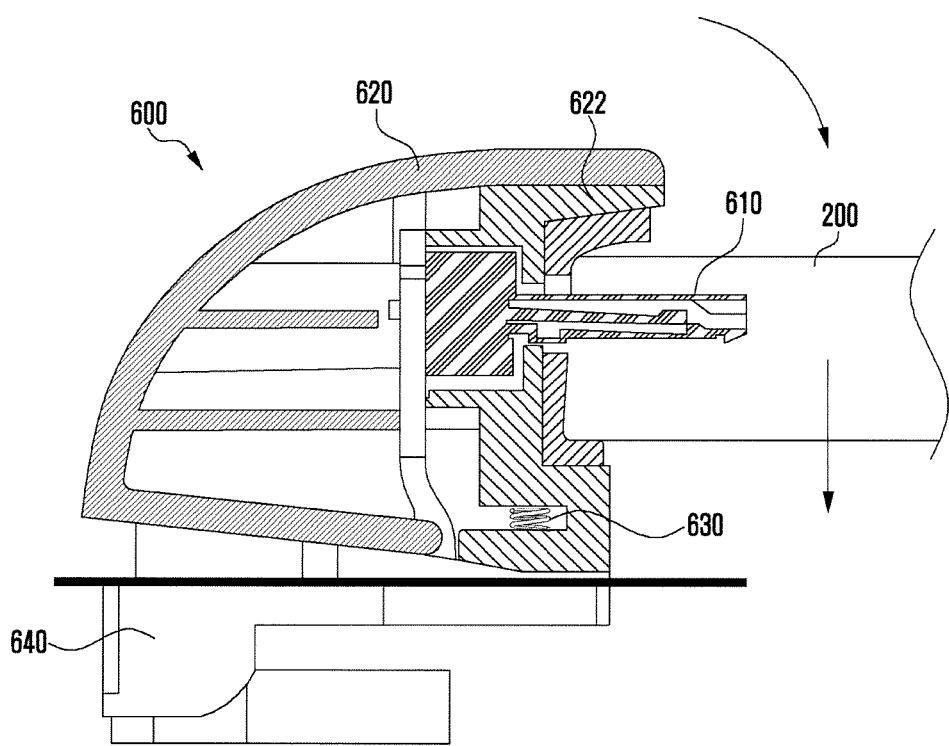
FIG. 8 illustrates a sectional view taken along line A-B in FIG. 5, in which the connector holder portion after fastening the terminal is illustrated in detail.
Figure 9:
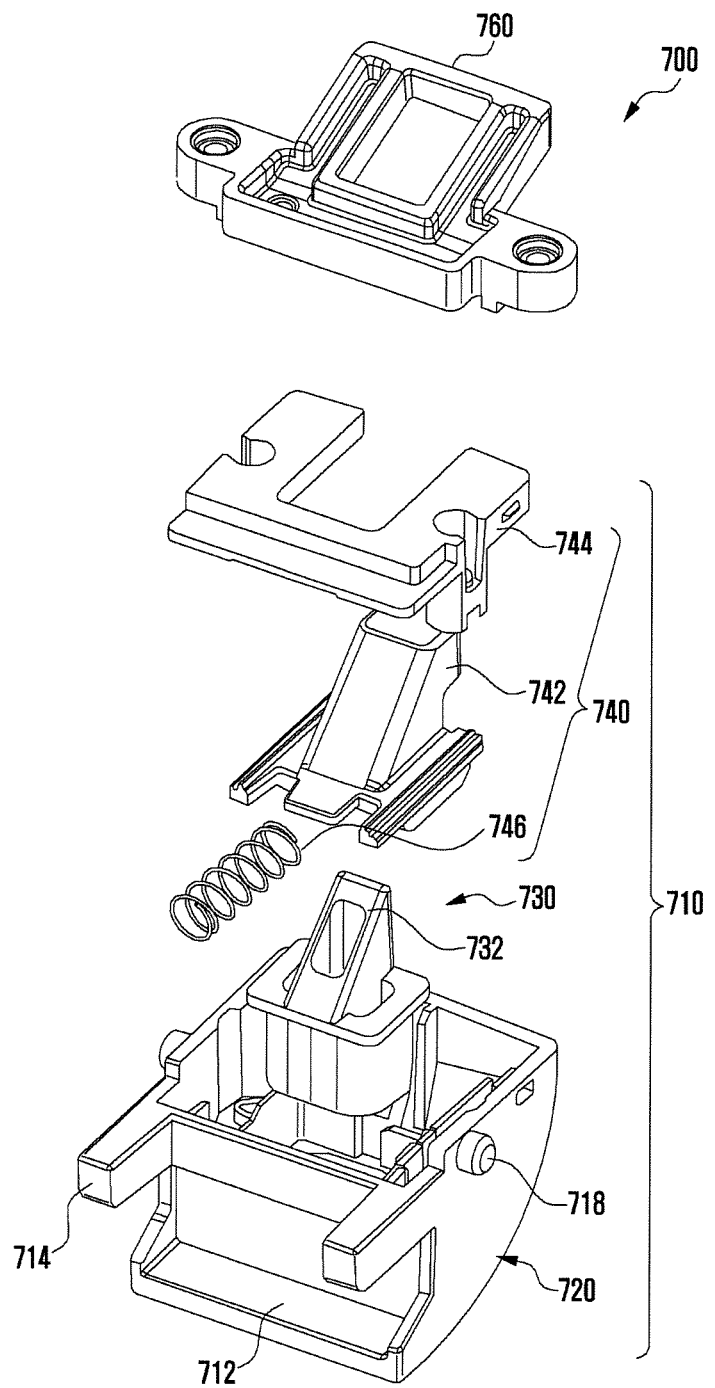
FIG. 9 illustrates a perspective view of a set holder in a reversed and disassembled state of a terminal fastening unit of the HMT device of FIG. 2.
Figure 10:
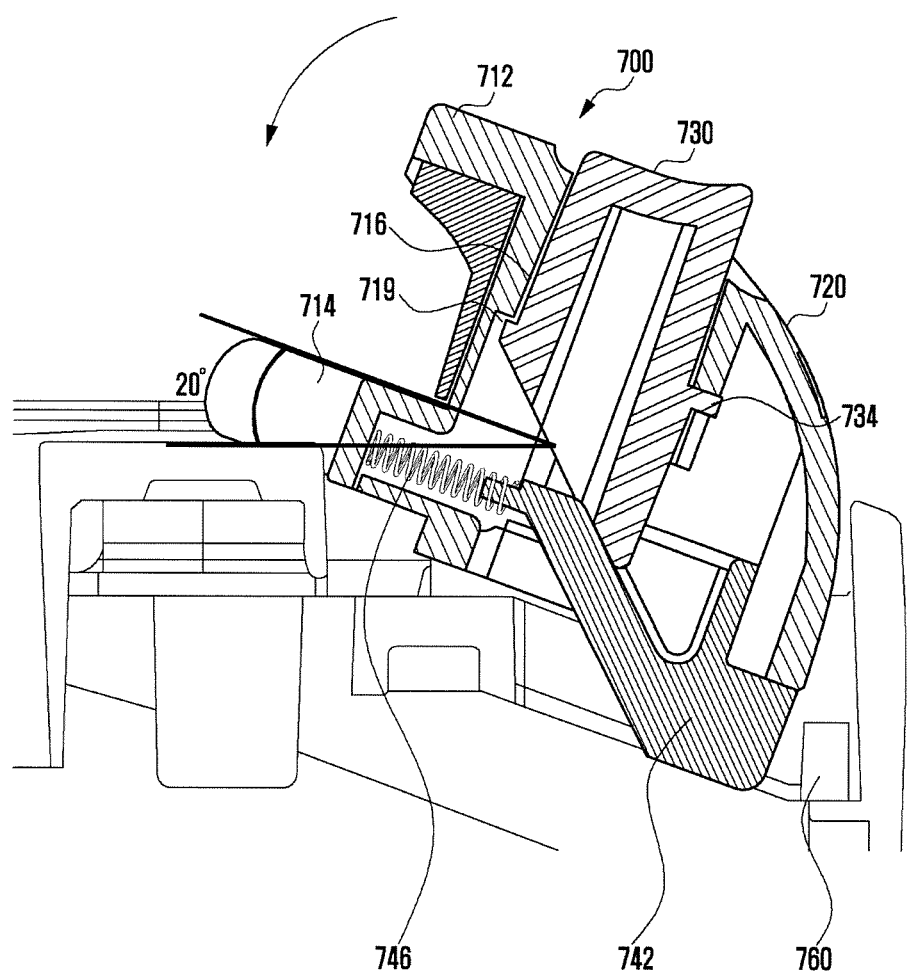
FIG. 10 illustrates a sectional view taken along line C-D in FIG. 5, in which a terminal holder portion before locking the terminal holder is illustrated in detail.
Figure 11:
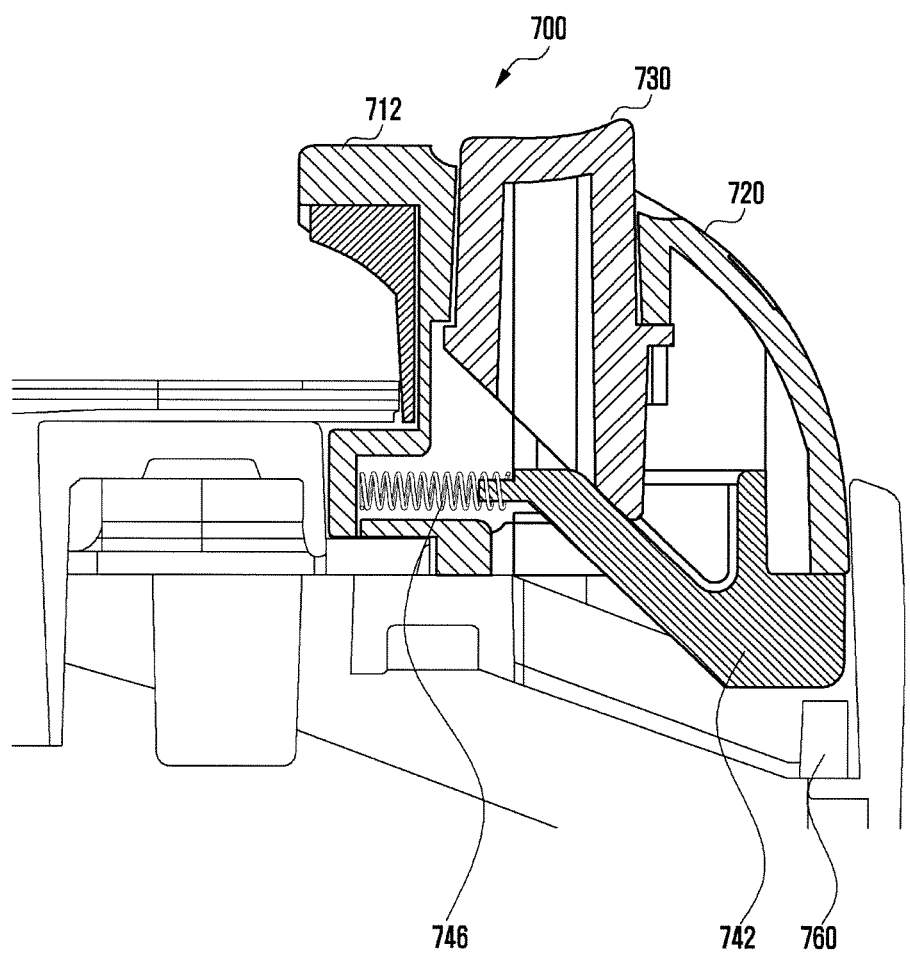
FIG. 11 illustrates a sectional view taken along line C-D in FIG. 5, in which the terminal holder portion after locking the terminal holder is illustrated in detail.
Figure 12:
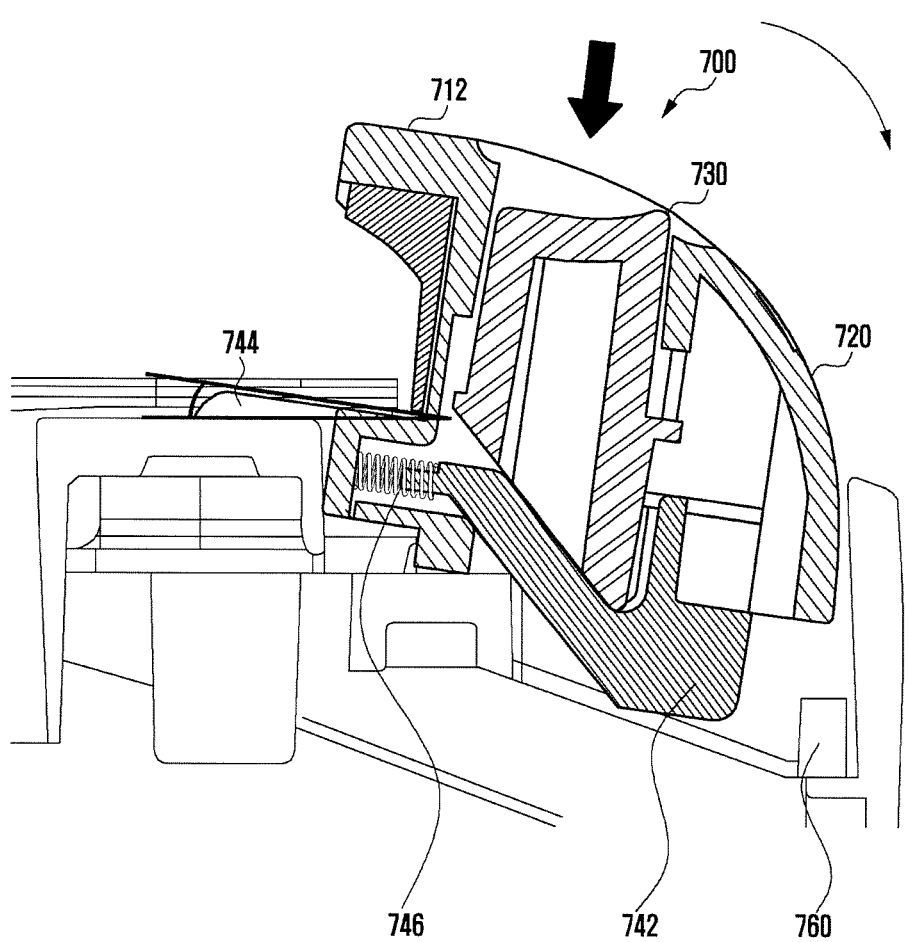
FIG. 12 illustrates a sectional view taken along line C-D in FIG. 5, in which the terminal holder portion after releasing the locking of the terminal holder is illustrated in detail.

Referring to FIGS. 6 to 8, the connector fastening part 600 may include a connector holder 620 including a USB connector 610, one or more springs 630 (only one is illustrated in the drawing) that press the connector holder 620 to a predetermined direction, and a connector holder dummy 640 that fixes the connector holder 620 to the main frame 110.

In one embodiment, a locking flange 622 protrudes from the upper portion of the connector holder 620 so as to lock the coupled external electronic device 200, and the USB connector 610 is positioned below the locking flange 622.

In addition, the connector holder 620 may include a hinge shaft 624 protruding from a side surface thereof so as to pivotally couple the main frame 110 thereto.

The USB connector 610 may be electrically connected with a flexible circuit board and a circuit board within the main frame 110, and may be inserted into a USB port of a smart phone terminal as the external electronic device 200. The connectors included in the connector holder 620 may include not only the USB connector, but also various types of connectors connectable with the external electronic device 200.

Before the external electronic device 200 is fastened, the connector holder 620 is maintained at a predetermined inclined state, for example, a first inclined opening angle state of about 9 degrees by the springs 630 and the connector holder dummy 640, and when the external electronic device 200 is fastened thereto, the connector holder 620 may be pivoted toward the mounting part 122 by the weight of the external electronic device 200 to be in the horizontal state.

As illustrated in FIG. 7, before the terminal is fastened, no weight is applied to the connector holder 620. Thus, the springs 630 are in the relaxed state and the connector holder dummy 640 is fastened to the main frame 110 through hook and screw-couplings not to be rotated over a predetermined inclined angle, thereby supporting the connector holder 620.

After the terminal is fastened, as illustrated in FIG. 8, the springs 630 are contracted due to the weight of the terminal, and the connector holder 620 is positioned at 0 degrees, i.e., in the horizontal state.

Referring to FIGS. 9 to 12, the terminal fastening unit 700 may include a terminal holder assembly 710 pivotally installed to the main frame 110, and a terminal holder dummy 760 fixed to the main frame 110 to guide the pivot of the terminal holder assembly 710.

The terminal holder assembly 710 may include a terminal holder 720, a release button 730 installed within the terminal holder 720 to be vertically movable, and a terminal locking unit 740 configured to lock the terminal holder 720.

The release button 730 may be pushed vertically downwardly according to the user's pushing.

The terminal locking unit 740 may include a holder pin 742 configured to convert a vertical movement of the release button 730 to a horizontal movement, a holder cap 744 configured to guide the operation of the holder pin 742, and an elastic spring 746 interposed between the release button 730 and the holder cap 744.

The terminal holder 720 may include the locking flange 712 protruding from the upper portion thereof to lock the external electronic device 200, a lift bar 714 protruding from the lower portion thereof to move up the mounted external electronic device 220, and a slide hole 716 formed in the central portion thereof to allow the release button 730 to vertically move therethrough.

In addition, the hinge shaft 718, shaft-coupled to the main frame 110, protrudes from the opposite side surfaces of the terminal holder 720.

In order to prevent the release button 730 from being excessively moved, a stopper protrusion 734 is formed on the release button 730 and a step 719, to which the stopper protrusion 734 is locked, may be formed in the slide hole 716.

An inclined portion 732 is formed on the release button 730 and inserted into a holder pin 742 having a shape corresponding to the inclined portion 732. The holder cap 744 has a shape including a first opening formed through at least a part thereof. When the holder pin 742 is rotated, a part of the holder pin 742 may pass through the opening portion of the holder cap 744.

The holder cap 744 is mounted in the terminal holder dummy 760, and terminal holder dummy 760 may include a second opening at the center thereof which is formed vertically through at least a part thereof to communicate with the opening of the holder cap 744.

Before the terminal holder 720 locks the external electronic device 200, the holder pin 742 is not locked to the second opening of the terminal holder dummy 760 and thus, is rotatable.

In the state where the terminal of the external electronic device 200 is mounted in the terminal holder 720, when the terminal holder 720 is rotated toward the outside of the mounting part 122 and pushed, the terminal holder 720 is locked to the main frame 110 through the terminal locking unit 740 so that the external electronic device 200 can be fixed to the main frame 110. At this time, the holder pin 742 may be locked to the step of the second opening of the terminal holder dummy 760 to be fixed.

When the terminal holder 720 is locked in the manner as described above, the terminal holder 720 is not released when a force is applied thereto in a direction opposite to the fastening direction.

In the case where the mounted terminal is removed, when release button 730 is pushed, the locking is released so that the holder pin 742 may be rotated toward the outside of the main frame 110.

The elastic spring 746 may press the release button 730 such that the release button 730 may always protrude from the terminal holder 720.

Before locking the terminal locking unit 740, the elastic spring 746 of the terminal locking unit 740 is in the relaxed state, and the release button 730 may remain in the protruding state.

Before the locking, since the holder pin 742 is not locked to the terminal holder dummy 760, the terminal holder dummy 760 may be rotated to its maximum opening state, for example, the second opening angle state of about 20 degrees, and after the locking, since the holder pin 742 is locked to the terminal holder dummy 760, the terminal holder dummy 760 may be in the fixed state and thus may remain in the horizontal state.

In addition, at the time of releasing the locking of the terminal locking unit 740, the release button 730 pushes the holder pin 742 while being vertically moved, and the holder pin 742 compresses the elastic spring 746 while being moved horizontally forward. At the same time, the locked state of the holder pin 742 in relation to the terminal holder dummy 760 is released and then the terminal fastening unit 700 starts to be inclined.

Figure 13:
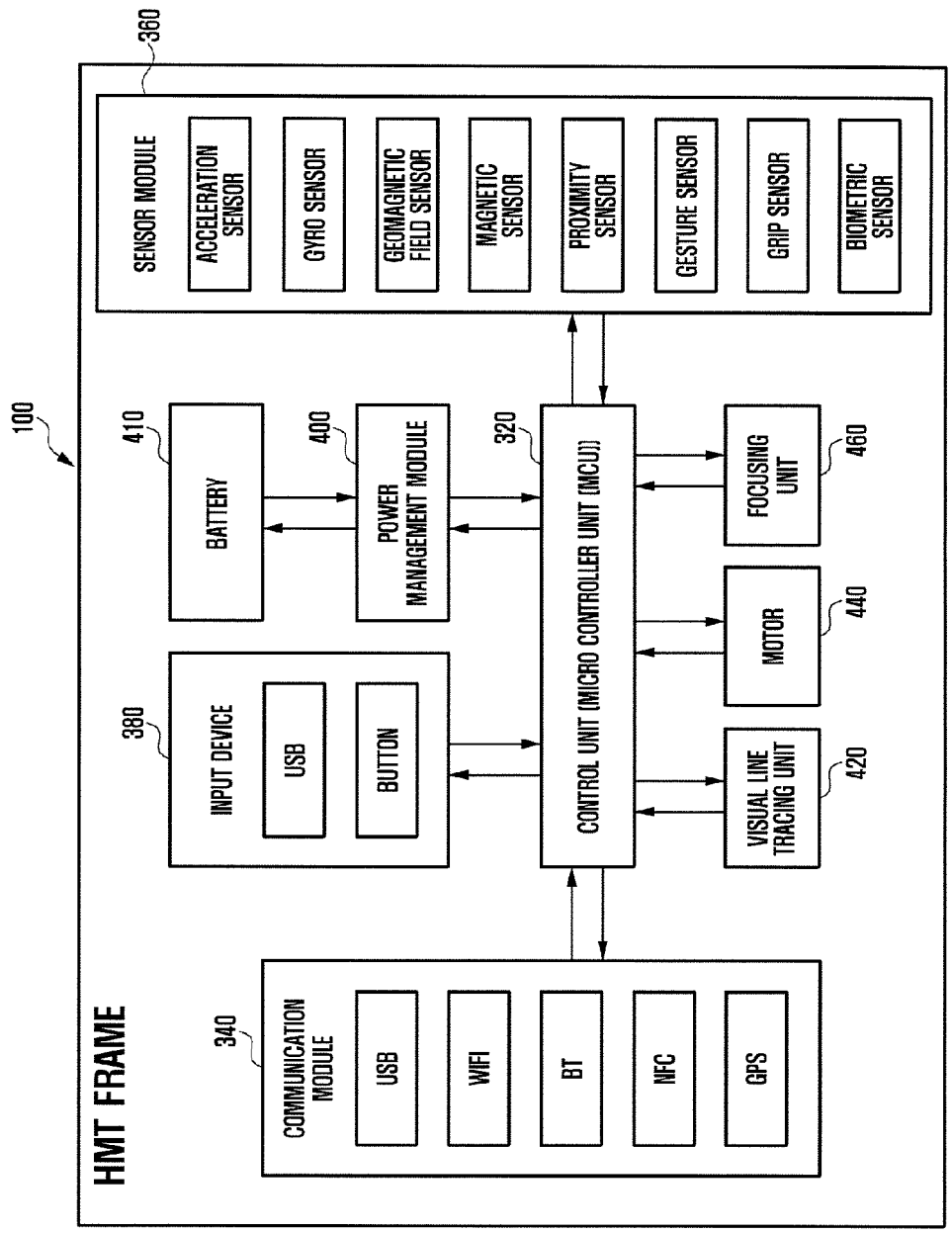
FIG. 13 illustrates a schematic block diagram illustrating a configuration of an HMT device according to various embodiments of the present disclosure.

FIG. 13 illustrates a schematic block diagram illustrating a configuration of an HMT device 100 according to various embodiments of the present disclosure.

Referring to FIG. 3, according to various embodiments, an HMT device 100 may generally comprise a control unit (Micro Controller Unit (MCU)) 320, a communication module 340, a sensor module 360, an input device 380, a power management module 400, a battery 410, a visual line tracing unit 420, a motor (vibrator) 440, and a focusing unit (adjustable optics or lens assembly) 460.

In the block diagram, other components (e.g., the display) are not illustrated for the convenience of description.

In another embodiment, some of the components illustrated in the block diagram may be included in the main frame 110, and other components may be included in the display device of the external electronic device 200 (e.g., a removably attached smart phone).

The control unit 320 may include, for example, a processor, and may drive an Operation System (OS) or an embedded S/W program so as to control a plurality of hardware components connected to the control unit 320.

The communication module 340 may electrically connect the main frame 110 of the HMT device 100 of the present disclosure and the external electronic device 200, for example, a smart phone terminal, using wired and/or wireless communications so as to execute data transmission/reception.

According to one embodiment, the communication module 340 may include a USB module, a Wifi module, a BT module, an NFC module, and a GPS module.

According to another embodiment, as least some (e.g., two or more) of the WiFi module, the BT module, the GPS module, and the NFC module are included in a single Integrated Chip (IC) or IC package.

The sensor module 360 may measure a physical amount or sense an operating condition of the HMT device, and convert the measured or sensed information into an electric signal. The sensor module 360 may include at least one of, e.g., an acceleration sensor, a gyro sensor, a geomagnetic field sensor, a magnetic sensor, a proximity sensor, a gesture sensor, a grip sensor, and a biometric sensor.

The movement of the user's head, on which the HMT device 100 is mounted, may be sensed using the acceleration sensor, the gyro sensor, and the geomagnetic field sensor.

It is possible to sense whether the HMT device 100 is mounted using the proximity sensor or the grip sensor.

In one embodiment, at least some components of the sensor module 360 may be included in the smart phone of the removably attached external electronic device 200.

According to one embodiment, it is possible to sense whether the user wears the HMT device by sensing at least one of IR recognition, compression recognition, and a change in the amount of capacitance (or dielectric permittivity) according to the user's wearing.

The gesture sensor may sense a movement of the user's hand or finger and receive it as an input operation of the HMT device 100 of the present disclosure.

Additionally or alternatively, the sensor module 360 may recognize the user's biometric information using biometric recognition sensors, such as an E-nose sensor, an EMG (electromyography) sensor, an EEG (electroencephalogram) sensor, an ECG (electrocardiogram) sensor, and an iris sensor.

The sensor module 360 may further include a control unit for controlling one or more sensors included therein.

The input device 380 may include a touch pad 112 and a button.

The touch pad 112 may recognize a touch input at least one of, e.g., a capacitive manner, a pressure-sensitive manner, an infrared manner, and an ultrasonic manner.

In addition, the touch pad 112 may further include a control circuit.

The capacitive manner enables recognition of a physical contact or proximity. The touch pad may further include a tactile layer.

In this case, the touch pad 112 may provide a tactile response to the user, and the button may include, for example, a physical button, an optical key, or a keypad.

The visual line tracing unit (eye tracker) 420 may trace the user's visual line using at least one of, e.g., an EOG (electrical oculography) sensor, a coil system, a dual Purkinje system, a Bright pupil system, and a dark pupil system.

In addition, the visual line tracing unit 420 may further include a micro camera for visual line tracing.

The focusing unit (adjustable optics) 440 may measure an Inter-Pupil Distance (IPD) and adjust the position of the display of the external electronic device 200 so that the user can enjoy an image suitable for the user's sight.

Figure 14:
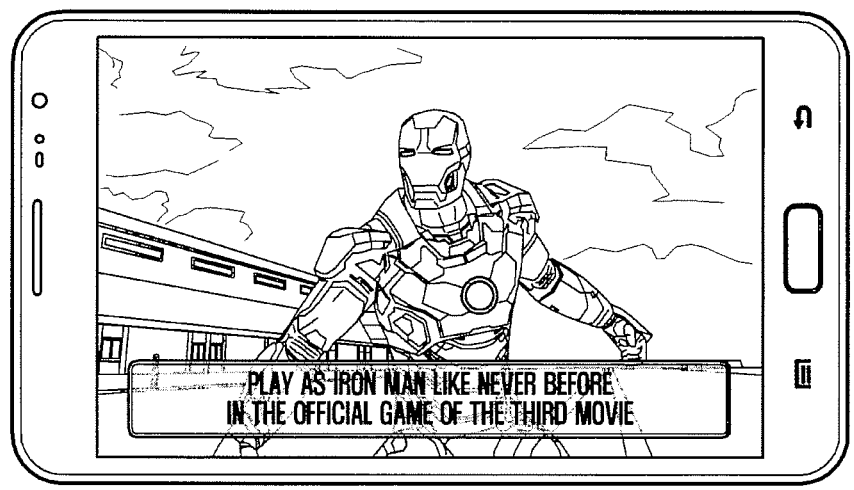
FIG. 14 illustrates a view for describing a normal mode of the HMT device, a Head-Mounted Mode (HMM) or Virtual Reality (VR) mode of a HMT device according to various embodiments of the present disclosure.
Figure 14:
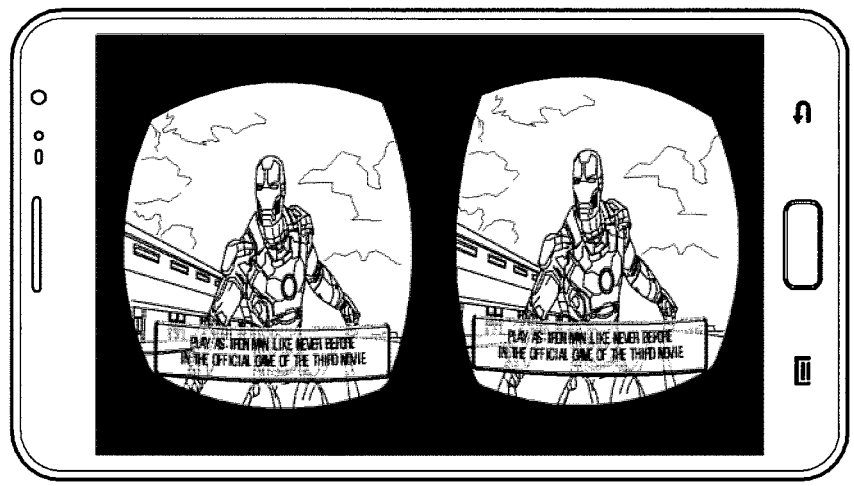

FIG. 14 is a view for describing a normal mode and a Head-Mounted Mode (HMM) or VR mode of the HMT device 100 according to various embodiments of the present disclosure.

The HMM or VR mode refers to a mode that provides, through a display, at least one of a see-through function that provides Augmented Reality (AR) and a see-closed function that provides Virtual Reality (VR). For example, when a smart phone is mounted and operated on the main frame 110 of the HMT device 100 of the present disclosure as the external electronic device 200, a normal mode may be switched to the HMM or VR mode.

In the HMM or VR mode, one image may be separated into two images and the two images may be expressed.

According to one embodiment, since an image may be distorted by the lens 260 included in the main frame 110, the HMM or VR mode may reversely distort a planar image according to a lens characteristic in order to provide a non-distorted image to the user.

Figure 15:
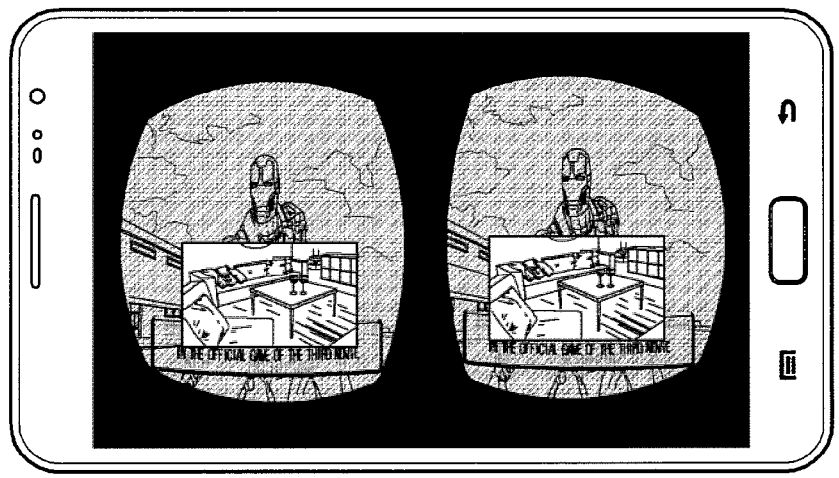
FIG. 15 illustrates a method of providing a see-through mode by the HMT device according to various embodiments of the present disclosure using a rear camera of a smart phone.
Figure 15:
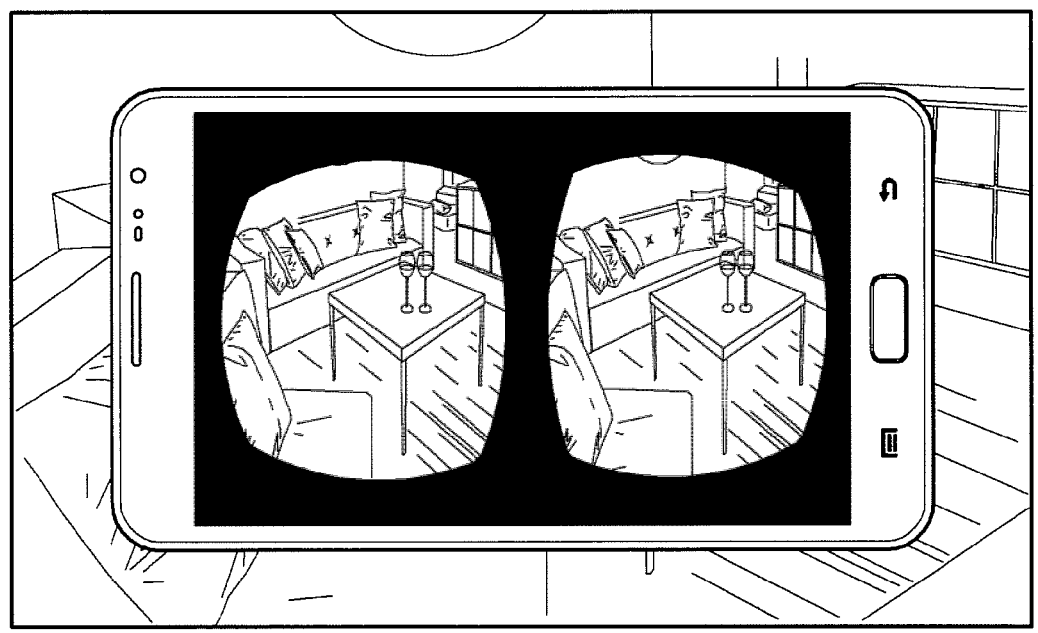

FIG. 15 illustrates a state, in which the HMT device according to various embodiments according to the present disclosure provides a see-through mode using a rear camera of a smart phone.

Referring to FIG. 15, the HMT device 100 of the present disclosure may provide a see-through mode using a rear camera of a smart phone as the external electronic device 200.

As one embodiment, a method of providing the see-through mode may operate the rear camera of the smart phone when a see-through mode switch button is pushed in the VR mode.

At this time, a preview screen of the rear camera may be displayed in the form of a PIP (Picture-In-Picture) in a region of an existing VR screen. The VR screen is switched to a background, and the camera preview screen may be extended to the entire region and displayed.

Through this, the user may experience an external virtual environment and at the same time, may confirm a surrounding environment through the camera image as needed.

Figure 16:
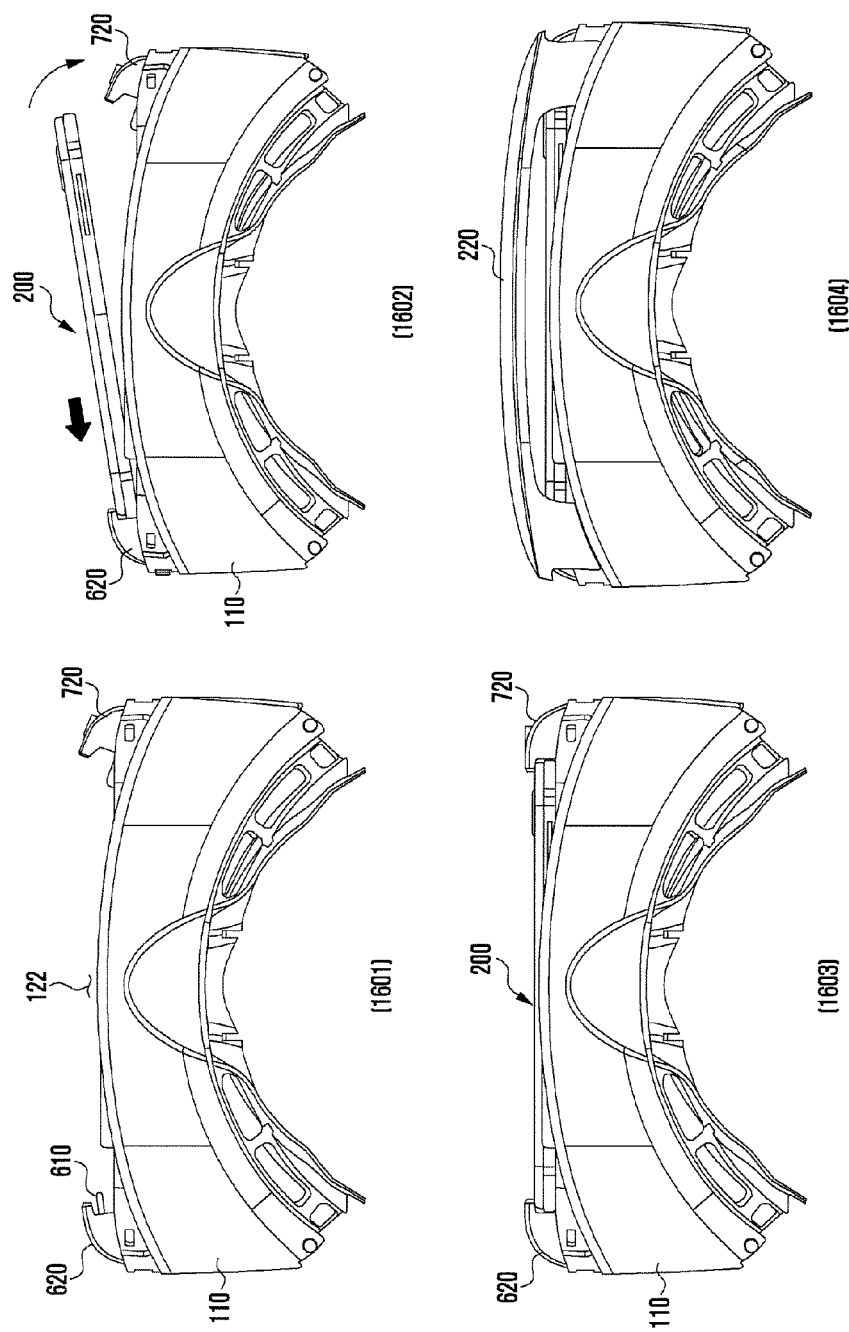
FIG. 16 illustrates a process of mounting a terminal on the HMT device of FIG. 1.

Hereinafter, descriptions will be made on an operation for mounting a terminal of the external electronic device 200 on the HMT device 100 of the present disclosure with reference to FIG. 16.

First, in the HMT device 100 of the present disclosure, before the terminal is mounted on the mainframe 110, the connector holder 620 at one side is inclined at a predetermined basic angle to be opened at a first inclined opening angle. Thus, the terminal of the external electronic device 200 can be fastened more easily.

The terminal holder 720 at the other side is configured to fix the terminal. Before fastening the terminal, the terminal holder 720 is inclined to the maximum to be prepared in the state of being opened at a second inclined opening angle (step 1601).

At this time, it is preferable that the second inclined opening angle is larger than the first inclined opening angle. That is, in step 1602, when the USB port at one side of the terminal is fastened to the USB connector 610 of the connector holder 620, the terminal and the connector holder 620 are rotated toward the terminal holder 720, i.e. toward the mounting part 122 by the weight of the terminal of the external electronic device 200 to become horizontal, and the terminal may be easily mounted in the terminal holder 720.

In step 1603, when the terminal mounted in the terminal holder 720 is pushed, the terminal holder 720 is rotated to the horizontal position, i.e. toward the mounting part 122 and fixed to the main frame 110, and as a result, the terminal may be fixed while it is maintained in the state of being mounted in the mounting part 122 of the frame 110.

In step 1604, the cover 220 is fastened to the main frame 110 so that the mounting is completed.

Figure 17:
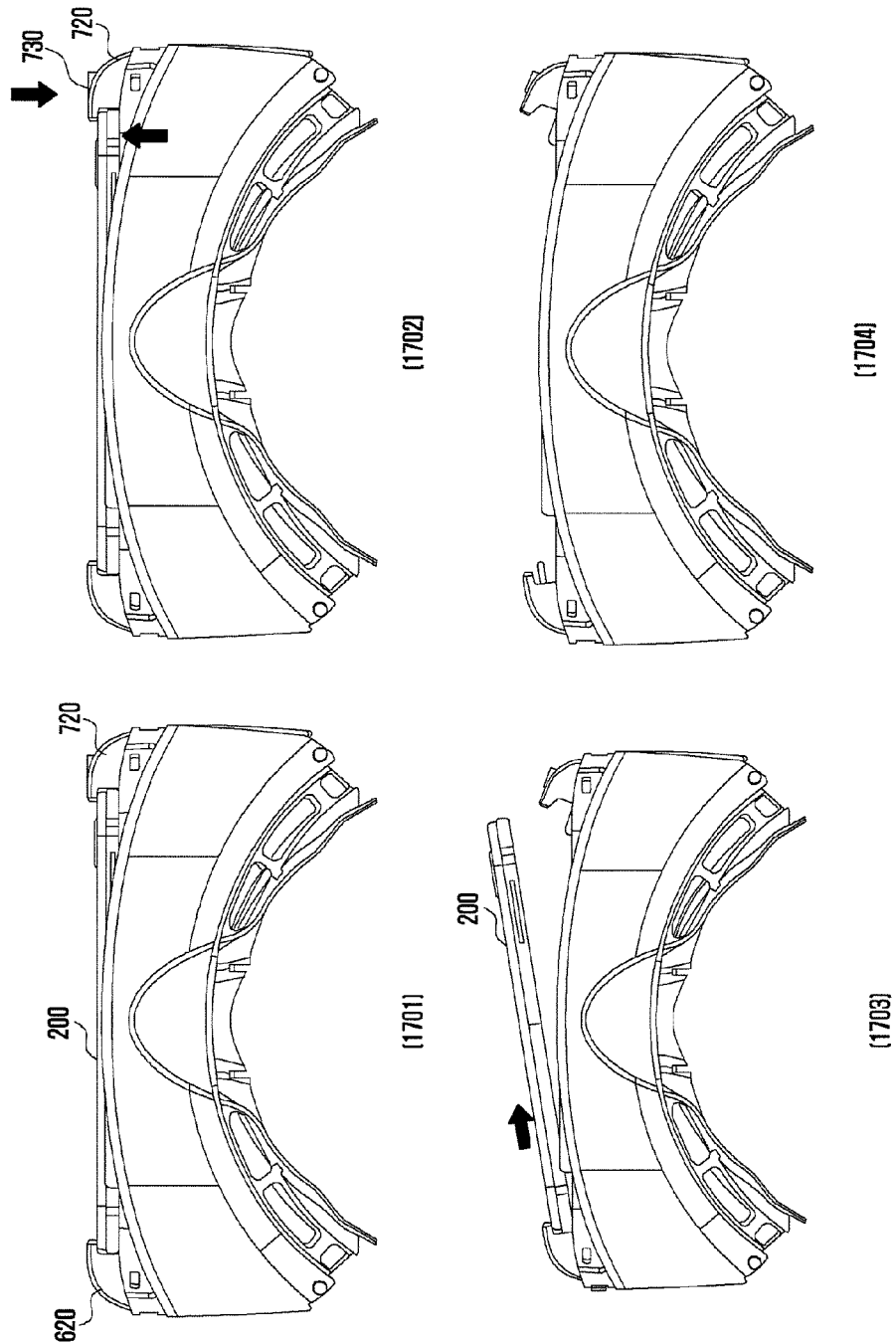
FIG. 17 illustrates a process of removing the terminal from the HMT device of FIG. 1

Now, descriptions will be made on an operation of removing the external electronic device 200 mounted on the HMT device 100 of the present disclosure with reference to FIG. 17.

The cover 220 fastened to the main frame 110 is removed to expose the terminal (step 1701).

In step 1702, the release button 730 is pushed to release the fixing of the terminal holder 720 by releasing the locking of the terminal locking unit 740, and at the same time, an end of the terminal is moved up. When the terminal is separated from the USB connector 610 in step 1703, the removal of the terminal is completed in step 1704.

As described above, according to various embodiments of the present disclosure, the HMT device 100 may be easily removed as the end of the terminal is moved up by the operation of the release button 730 at the time of removal.

As described above, according to various embodiments of the present disclosure, the HMT device 100 of the present disclosure allows the terminal of the external electronic device 200 to be mounted on or removed from the main frame 110, and through this, the display mode of the terminal may be changed from the normal mode to the HMD mode.

For example, when a smart phone terminal is mounted on the HMT device 100 of the present disclosure and operated, as illustrated in FIG. 14, the normal mode may be switched to the HMM or VR mode, in which one image is separated into two images and the two images are expressed.

The mode change may be directly performed by the user on the terminal, but may be automatically performed through various embodiments.

For example, the mode may be automatically switched in a mechanical manner using a contact or coupling.

When a separate switch (not illustrated) is installed on one surface of the main frame 110 to be in contact with the terminal, the terminal is connected to the USB connector 610, and then the terminal is pushed so that the switch installed on the main frame 110 is pushed. Through this, it may be recognized that the terminal is fastened, and the mode change may be performed.

The switch may be mounted at any position where the terminal and the frame come in contact with each other, and through this, the mounting and removal of the terminal may be recognized.

When the terminal is connected to the USB connector 610 of the main frame 110, the mounting of the terminal may be recognized after exchanging an electrical signal.

The mounting of the terminal may be recognized through various sensors installed on the terminal or the frame (e.g., a proximity sensor, an illumination sensor, and a magnetic sensor) so as to automatically switch the modes.

Figure 18:
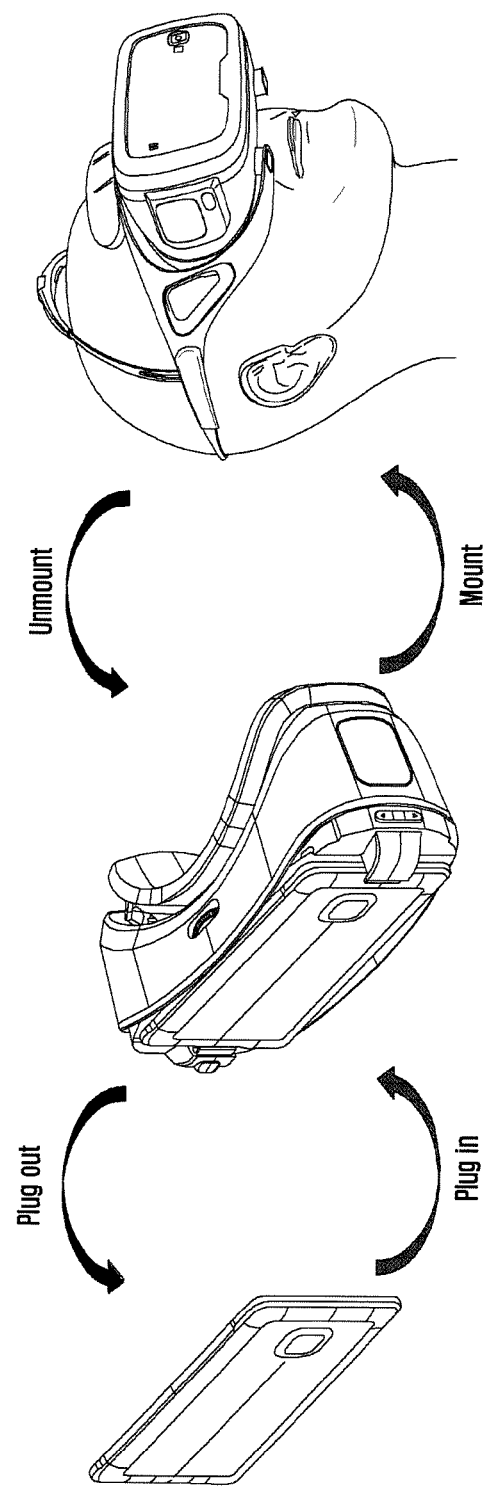
FIG. 18 illustrates a mode conversion according to a plug-in/plug-out state of the terminal and mount/demount state of the frame state according to various embodiments of the present disclosure.

The automatic mode switching will be described in more detail. As illustrated in FIG. 18, the switching method may be divided into a step of plug-in/plug-out of the terminal in relation to the frame, and a step of mount/unmount by the user in the state where the terminal is mounted on the frame.

For example, when the smart phone terminal is in the normal 2D state by being plugged out, the VR service is ended and VR applications are also ended through the VR service.

Unlike this, when the smart phone terminal is in the plug-in state and is in the unmount state in the SMT device, the VR service is internally operated and a mono image is displayed on a screen. AT this time, it is required to make the driving invisible to two eyes.

At the time of plug-in, a VR application is started. For the purpose of rapid appearance of a VR screen at the time of mount, a VR application, i.e. a VR home screen may be driven as a background in advance in an under layer below a mono image.

At this time, a configuration may be made such that an audio notice may be set to ON so that when there is a phone call or a notice message, the user can confirm it.

In addition, when a separate sleep time out (VR sleep) is executed and thus the user does not wear the HMT device, the power may be saved through LCD OFF.

When switching from the unmount state to the mount state is performed, the mono image, which has been displayed, is removed and the VR application (stereoscopic), which is being driven in the under layer, naturally appears on the screen.

In the unmount state, the audio alarm may be turned OFF so that enjoying contents may not be disturbed.

As described above, the HMT device according to an embodiment of the present disclosure allows a user to easily perform mount/demount of the terminal and the frame, and recognizes the mount/demount of the terminal to be automatically switched to the HMD mode. Thus, the HMT device can provide convenient usability to the user.

Although the present disclosure has been described with embodiments, various changes and modifications may be suggested to one skilled in the art. It is intended that the present disclosure encompass such changes and modifications as fall within the scope of the appended claims.

What is claimed is:

1. A head-mounted display device comprising:
   a frame including a first surface formed according to a face of a user;
   a wearing part formed to couple to at least a part of the frame so as to allow the frame to be fixed to the face;
   a mounting part formed as a cavity structure of the frame and configured to mount an external electronic device to a second surface of the frame; and
   one or more fastening parts pivotally coupled to the frame, wherein the one or more fastening parts is configured to pivot to fix the external electronic device to the mounting part, and
   wherein the one or more fastening parts have an inclined opening angle.

2. The head-mounted display device of claim 1, wherein the one or more fastening parts include a connector fastening part having a first inclined opening angle and a terminal fastening part having a second inclined opening angle.

3. The head-mounted display device of claim 2, wherein when one end of the external electronic device is coupled to the connector fastening part and another end of the external electronic device is mounted on the terminal fastening part, the connector fastening part pivots to a horizontal position by a weight of the external electronic device, and the terminal fastening part pivots to a horizontal position to fix the external electronic device.

4. The head-mounted display device of claim 2, wherein the connector fastening part includes a connector holder including a USB connector, a spring configured to press the connector holder in a predetermined direction, and a connector holder dummy configured to fix the connector holder to the frame.

5. The head-mounted display device of claim 4, wherein before the external electronic device is fastened, the spring and the connector holder dummy are configured to together maintain the connector holder at the first inclined opening angle.

6. The head-mounted display device of claim 2, wherein the terminal fastening part includes:
   a terminal holder,
   a release button within the terminal holder and configured to be vertically movable,
   a terminal holder assembly including a terminal locking unit configured to lock the terminal holder, the terminal holder assembly pivotally coupled to the frame, and
   a terminal holder dummy fixed to the frame and configured to guide a pivot of the terminal holder assembly.

7. The head-mounted display device of claim 6, wherein the terminal locking unit includes:
   a holder pin configured to convert a vertical movement of the release button into a horizontal movement,
   a holder cap configured to guide operation of the holder pin, and
   an elastic spring interposed between the release button and the holder cap.

8. The head-mounted display device of claim 6, wherein the terminal holder includes:
   a locking flange that protrudes from an upper portion of the terminal holder and configured to lock the mounted external electronic device,
   a lift bar that protrudes from a lower portion of the terminal holder and configured to move up the external electronic device,
   a slide hole formed in a central portion of the terminal holder and configured to allow the release button to be vertically moved through the slide hole, and
   a hinge shaft that protrudes laterally and is configured to be shaft-coupled to the frame.

9. The head-mounted display device of claim 8, wherein the slide hole includes a stopper protrusion configured to prevent the release button from moving beyond a predetermined amount.

10. The head-mounted display device of claim 7, wherein:
    the release button includes an inclined portion,
    the inclined portion is configured to insert into the holder pin having a corresponding shape, and
    the holder cap includes an opened portion through which the holder pin passes during rotation of the holder pin.

11. The head-mounted display device of claim 7, wherein when the external electronic device is not locked by the terminal holder, the holder pin is rotatable without being locked to the terminal holder dummy.

12. The head-mounted display device of claim 7, wherein the holder pin is configured lock to the terminal holder dummy to be fixed when the terminal holder is rotated to lock the external electronic device.

13. The head-mounted display device of claim 11, wherein the holder pin is configured to unlock from the terminal holder dummy and to release the holder pin to rotate when the release button is pushed in a state where the holder pin is locked to the terminal holder dummy.

14. The head-mounted display device of claim 7, wherein the elastic spring is disposed continuously to press the release button to protrude from the terminal holder.

15. The head-mounted display device of claim 7, wherein regardless of whether the terminal locking unit is locked, the elastic spring is in a relaxed state and the release button maintains the protruding state.

16. The head-mounted display device of claim 7, wherein:
    the holder pin is configured to be not locked to the terminal holder dummy to enable the holder pin to rotate to the second inclined opening angle when the terminal locking unit is not locked, and
    the holder pin is configured to be locked to the terminal holder dummy in a fixed state to enable the holder pin to maintain the terminal holder in a horizontal position when the terminal locking unit is locked.

17. The head-mounted display device of claim 7, wherein:
    the release button is configured to move vertically and to push the holder pin horizontally forward to contract the elastic spring when the terminal locking unit is released from being locked, and
    the locked state of the holder pin in relation to the terminal holder dummy is configured to release the terminal fastening part to incline when the terminal locking unit is released from being locked.

18. The head-mounted display device of claim 2, wherein the second inclined opening angle is larger than the first inclined opening angle.

19. The head-mounted display device of claim 6, wherein when the release button is pushed, one end of the external electronic device is moved up to remove the external electronic device.

20. The head-mounted display device of claim 1, further comprising a cover configured to couple to the frame.

21. The head-mounted display device of claim 20, wherein the cover comprises a window on a front surface thereof.

22. The head-mounted display device of claim 20, wherein the cover includes one or more openings.

23. The head-mounted display device of claim 1, wherein the external electronic device is configured to change a normal display mode to a Head-Mounted Mode (HMM) or Virtual Reality (VR) mode that provides a see-closed function that provides Virtual Reality.

24. The head-mounted display device of claim 23, wherein the mode conversion is performed in a mechanical or electronic manner.

25. The head-mounted display device of claim 24, wherein the mechanical mode conversion is performed by one or more switches or buttons.

26. The head-mounted display device of claim 24, wherein the electronic mode conversion is performed by at least one of a proximity sensor, an illumination sensor, a magnetic sensor, and an infrared sensor.

* * * * *